United States Patent
Li et al.

(10) Patent No.: US 8,569,173 B2
(45) Date of Patent: Oct. 29, 2013

(54) METHODS OF PROTECTING ELEVATED POLYSILICON STRUCTURES DURING ETCHING PROCESSES

(75) Inventors: Liang Li, Singapore (SG); Huang Liu, Singapore (SG); Alex See, Singapore (SG); Soh Yun Siah, Singapore (SG); Xue Song Rao, Singapore (SG); Peng Zhou, Singapore (SG)

(73) Assignee: GLOBALFOUNDRIES Singapore Pte Ltd, Singapore (SG)

( * ) Notice: Subject to any disclaimer, the term of this patent is extended or adjusted under 35 U.S.C. 154(b) by 45 days.

(21) Appl. No.: 13/314,270

(22) Filed: Dec. 8, 2011

(65) Prior Publication Data

US 2013/0149851 A1  Jun. 13, 2013

(51) Int. Cl.
*H01L 21/302* (2006.01)

(52) U.S. Cl.
USPC .......................................... 438/689

(58) Field of Classification Search
USPC .................................. 438/585, 787, 689
See application file for complete search history.

(56) References Cited

U.S. PATENT DOCUMENTS

| 7,419,869 B2 * | 9/2008 | Hosoda et al. ................ 438/238 |
| 2012/0129317 A1 * | 5/2012 | Funayama et al. ............ 438/424 |

* cited by examiner

*Primary Examiner* — Bradley K Smith
(74) *Attorney, Agent, or Firm* — Williams, Morgan & Amerson, P.C.

(57) ABSTRACT

Disclosed herein are various methods of protecting elevated polysilicon structures during etching processes. In one example, the method includes forming a layer stack above a semiconducting substrate for a memory device, forming a protective mask layer above the layer stack of the memory device and performing at least one etching process to define a gate electrode for a transistor while the protective mask is in position above the layer stack for the memory device.

12 Claims, 6 Drawing Sheets

METHODS OF PROTECTING ELEVATED POLYSILICON STRUCTURES DURING ETCHING PROCESSES

BACKGROUND OF THE INVENTION

1. Field of the Invention

Generally, the present disclosure relates to the manufacturing of sophisticated semiconductor devices, and, more specifically, to various methods of protecting elevated polysilicon structures during etching processes.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit elements that substantially determine performance of the integrated circuits. Such field effect transistors are frequently employed in making so-called "logic" circuits on a chip containing the integrated circuits. Such integrated circuit chips also may include many memory devices, such as Dynamic Random Access Memory (DRAMs) devices.

In fact, many modern integrated circuit chips may have one or more "logic regions" where primarily logic circuits or logic devices are made and one or more "memory regions or arrays" that primarily contain memory devices. Although the logic devices and memory devices are typically formed on the same chip, and they frequently share common materials, such devices do have fundamental structural differences, and they may typically be formed at different times during a particular process flow that is performed to form the completed integrated circuit device.

As one specific example, a logic circuit may typically be formed using a multitude of field effect transistors. A basic field effect transistor comprises a source region, a gate region and a channel region positioned between the source and drain regions. Such a transistor further includes a gate insulation layer positioned above the channel region and a gate electrode positioned above the gate insulation layer. When an appropriate voltage is applied to the gate electrode, the channel region becomes conductive and current may flow from the source region to the drain region. In many cases, the gate electrodes are made of polysilicon.

A typical DRAM device includes, among other things, a stack of layers. More specifically, a DRAM device typically includes a gate insulation layer, a so-called floating gate formed above the gate insulation layer, one or more layers of insulating material positioned above the floating gate and a control gate positioned above the latter layer of insulating material. In many cases, the control gate and the floating gate are made of polysilicon.

The basic structures of the field effect transistors and of the memory devices are typically formed by forming various layers of material and thereafter patterning those layers of material using known photolithography and etching processes. It is frequently the case that the basic layer stack for the memory devices, including the floating gate and the control gate, is formed prior to forming the gate electrodes for the transistors in the logic regions of the device. Typically, in patterning the gate electrodes for the logic devices, in one illustrative process flow, a tri-layer stack of materials is formed above the gate electrode material layer, typically polysilicon, in the logic regions, and above the previously formed stack of materials, including the floating gate and the control gate, for the memory devices in the memory regions. In one illustrative example, the tri-layer of materials is comprised of, for example, an organic dielectric layer (ODL) formed above the gate electrode material layer, an antireflective coating (ARC) layer positioned above of the ODL layer and a patterned layer of photoresist formed above the ARC layer.

Given the structural differences between the memory devices (which includes both a floating gate and a control gate) and the basic field effect transistors (which includes a single gate electrode) there is a significant topography difference between the memory regions and the logic regions, i.e., the basic memory stack is much taller than the stack of materials used to form the gate electrode structures in the logic areas. Unfortunately, this height difference may lead to the situation where the tri-layer of materials does not adequately cover or adequately protect the taller structures in the memory regions. That is, in some cases, certain features of the taller memory structures, e.g., the control gate that is comprised of polysilicon, may actually be damaged during the etching processes that are performed to define the gate electrodes for the logic devices. At best, such damage can reduce the electrical performance of the memory device and the circuits incorporating such devices, and, in a worst case scenario, depending upon the extent of the damage, may result in complete device failure.

The present disclosure is directed to various methods that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of protecting elevated polysilicon structures during etching processes. In one example, the method includes forming a layer stack above a semiconducting substrate for a memory device, forming a protective mask layer above the layer stack of the memory device and performing at least one etching process to define a gate electrode for a transistor while the protective mask is in position above the layer stack for the memory device.

In another illustrative example, a method is disclosed that includes forming a layer stack above a semiconducting substrate for a memory device, forming a layer of gate electrode material for a transistor and forming a protective mask layer above the layer stack for the memory device and above the layer of gate electrode material. In this illustrative example, the method further includes the steps of performing at least one etching process to remove the protective mask layer from above layer of gate electrode material to thereby define a protective mask positioned above the layer stack for the memory device and performing at least one etching process on the layer of gate electrode material to define a gate electrode for a transistor while the protective mask is in position above the layer stack for the memory device.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of protecting elevated polysilicon structures during etching processes. As will be readily apparent to those skilled in the art upon a complete reading of the present application, the present method is applicable to a variety of devices, including, but not limited to, logic devices, memory devices, etc. With reference to FIGS. 1A-1G and 2A-2F, various illustrative embodiments of the methods disclosed herein will now be described in more detail.

Figure 1A:
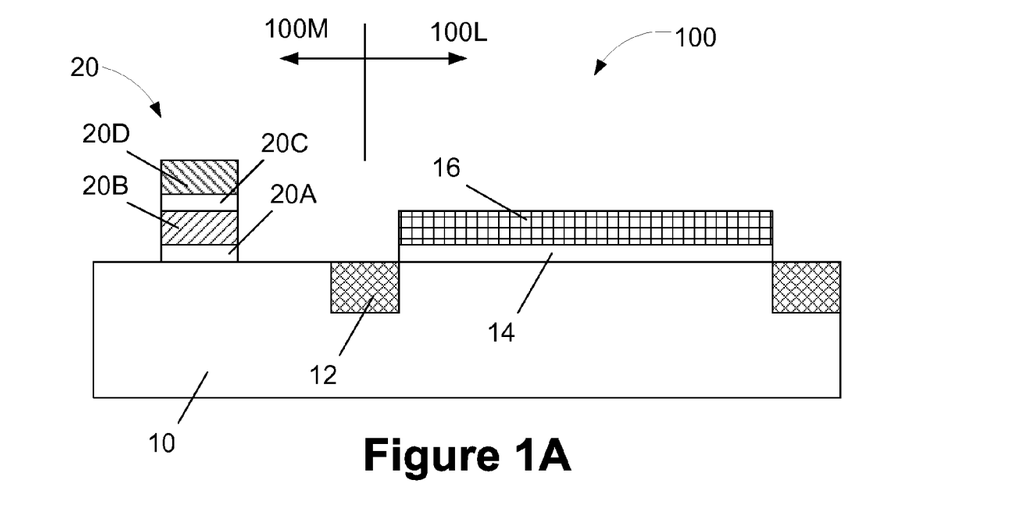
FIGS. 1A-1G depict various illustrative methods of protecting elevated polysilicon structures during etching processes.

FIG. 1A is a simplified view of an illustrative semiconductor device 100 at an early stage of manufacturing that is formed above a bulk semiconducting substrate 10. In general, the device 100 is comprised of a logic region 100L, where at least some logic circuitry will be formed, and a memory region 100M, where at least some memory devices will be formed. The substrate 10 may be comprised of a variety of semiconducting materials such as, for example, silicon or silicon germanium, etc. Illustrative trench isolation structures 12 have also been formed in the substrate 10.

At the point of fabrication depicted in FIG. 1A, the basic layer stack of a memory device 20 has been formed in the memory region 100m using know techniques and materials. In the illustrative example depicted in FIG. 1A, the layer stack of the memory device 200 comprises a gate insulation layer 20A, a floating gate 20B, another layer(s) of insulating material 20C and a control gate 20D. The memory device 20 is intended to be representative in nature and it does not include all features of the completed memory device 20, such as various doped regions, sidewall spacers, conductive contacts, etc. The layer stack for the memory device 20 may be formed by forming the various layers of material and thereafter performing one or more etching processes to define the basic layer stack for the memory device 20. In one illustrative embodiment, the gate insulation layer 20A may be comprised of, for example, silicon dioxide, it may be formed by either a thermal growth process or by a deposition process, such as a chemical vapor deposition (CVD) process, and it may have a thickness of about 5-10 nm. The floating gate 20B and the control gate 20D may be comprised of a variety of materials such as, for example, polysilicon, etc. The floating gate 20B and the control gate 20D need not be made of the same material although they may be. In one illustrative embodiment, both the floating gate 20B and the control gate 20D may be comprised of polysilicon, they may be formed by performing a CVD or a furnace process, and they each may have a thickness that ranges from about 80-100 nm. The insulating layer 20C may be comprised of one or more layers of insulating material such as, for example a multi-layer stack of oxide-nitride-oxide (ONO), and it may have an overall thickness of about 10 nm. In other cases, different materials and different numbers of layers of materials may be employed. Thus, the particular details of the memory device 20, the materials used in its construction and the manner in which it is made should not be considered a limitation of the presently disclosed inventions.

With continuing reference to FIG. 1A, in the logic region 100L, an illustrative gate insulation layer 14 and a layer of gate electrode material 16 is formed above the gate insulation layer 14. The gate insulation layer 14 may be comprised of a variety of different materials, such as, for example, silicon dioxide, a so-called high-k (k greater than 10) insulation material, etc. Similarly, the gate electrode material may also be of a material such as polysilicon or amorphous silicon, or it may be comprised of one or more metal layers. As will be recognized by those skilled in the art after a complete reading of the present application, the gate structures for various transistors that will be formed in the logic region 100L of the device 100 may be comprised of a variety of different materials and such gate structures may have a variety of configurations, and the ultimate gate structures in the logic region 100L may be made using either so-called "gate-first" or "gate-last" techniques. In one illustrative embodiment, the gate electrode material layer 16 may be made of polysilicon, it may be made by performing a CVD process, and it may have a thickness that ranges from about 100 nm.

Figure 1B:
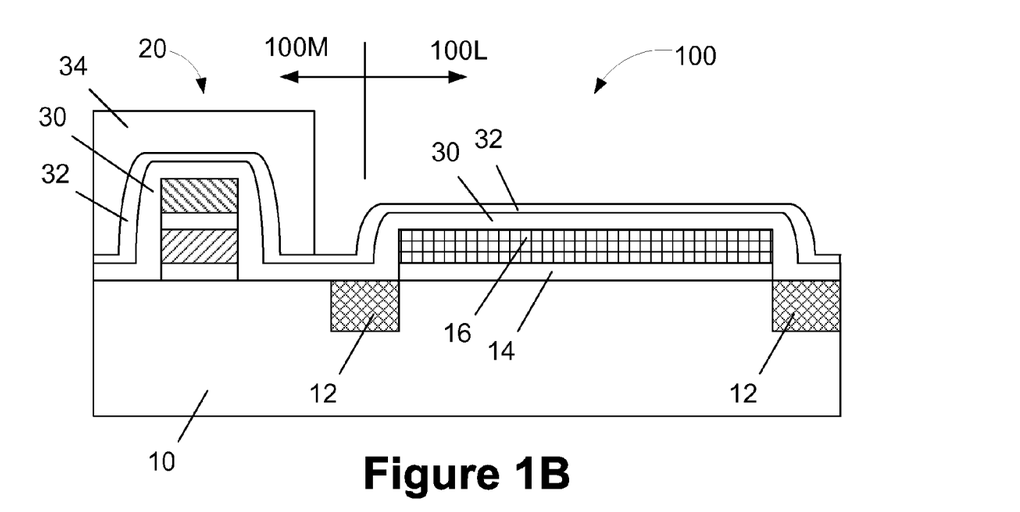

Next, as shown in FIG. 1B, a protective mask layer 30 and antireflective coating (ARC) layer 32 are formed above the device 100 in both the logic region 100L and the memory region 100M, and a masking layer 34 is formed above the memory device 20. The protective mask layer 30 may be either a hard mask layer or a soft mask layer. The protective mask layer 30 may be comprised of a variety of different materials such as carbon based materials like amorphous carbon, near frictionless carbon (NFC), an organic material like a hardened resist material, etc. In general, the protective mask layer 30 may be made of any material that exhibits a relatively low etch rate when exposed to etch processes used to etch polysilicon, like etch processes that use chlorine or SF6, but at the same time is a material that exhibits a relatively high etch rate when exposed to an oxygen-based etching or stripping process, which allows the protective mask layer 30 to be easily removed after it has served its protective purpose. In one illustrative embodiment, the protective mask layer 30 is a hard mask layer comprised of amorphous carbon having a thickness of about 80-100 nm that is initially formed by performing a plasma enhanced CVD process. The ARC layer 32 may be comprised of a variety of different materials such as, for example, silicon oxynitride, carbon-doped silicon oxide, etc. In one illustrative embodiment, the ARC layer 32 is a layer of carbon-doped silicon oxide having a thickness of about 20-30 nm that is initially formed by performing a CVD process. The patterned mask layer 34 may be a patterned layer of photoresist that may be formed using known photolithography tools and techniques.

Figure 1C:
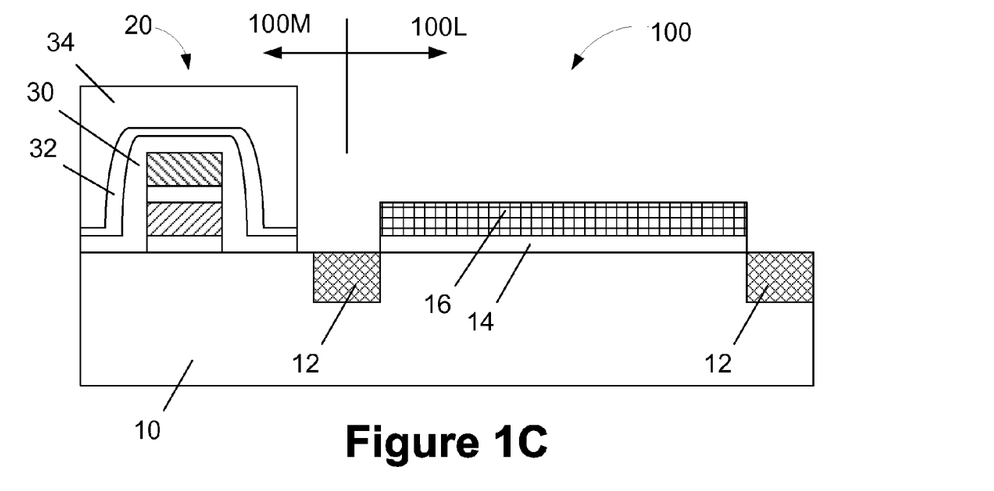

Next, as shown in FIG. 1C, one or more dry or wet etching processes are performed through the mask layer 34 to remove the exposed portions of the protective hard mask layer 30 and the ARC layer 32. In one illustrative embodiment, one or more dry anisotropic etching processes are performed to remove the exposed portions of the protective hard mask layer 30 and the ARC layer 32.

Figure 1D:
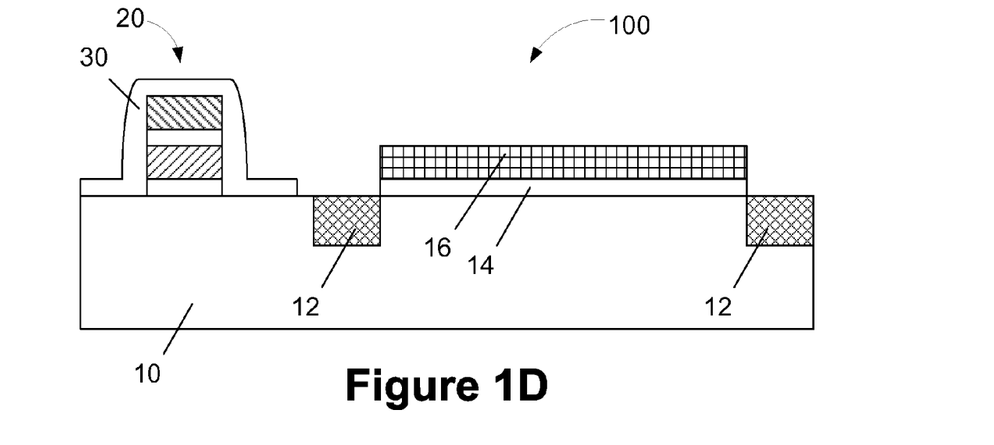

Thereafter, as shown in FIG. 1D, the mask layer 34 is removed from the memory region 100M. The mask layer 34 may be removed by performing any of a variety of known techniques, e.g., an ashing process.

Figure 1E:
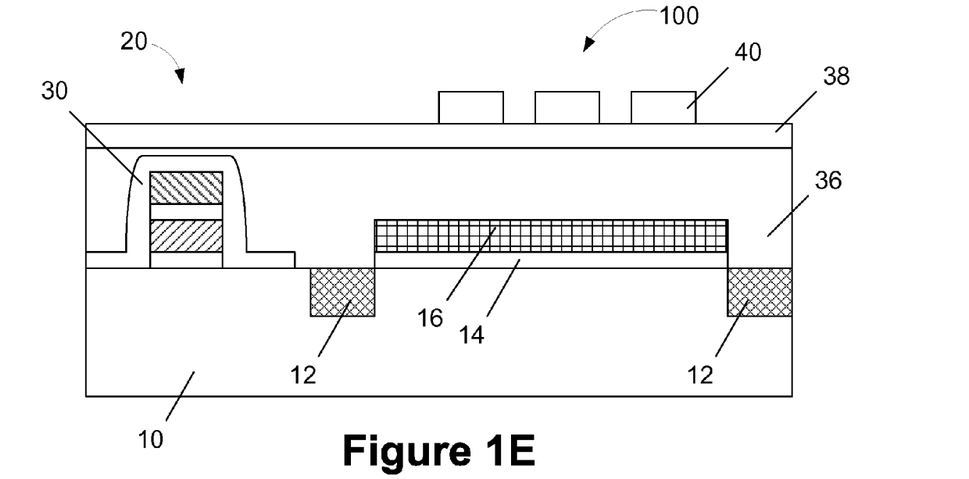

The next process operation generally involves forming gate electrode structures for the logic devices in the logic region 100L. To that end, in one illustrative embodiment, a multi-layer system is employed to accomplish this task. As shown in FIG. 1E, in one illustrative example, an ODL layer 36, an ARC layer 38 and a patterned mask layer 40 is formed above the device 100. Note that the protective hard mask layer 30 remains on the memory device 20 during this process. Without the hard mask layer 30, depending upon the thickness of the ODL layer 36 and the ARC layer 38, a situation may arise where the combined height of the ODL layer 36 and the ARC layer 38 would offer little if any protection to the memory device 20 during the etching process that is performed to form the gate electrode structures (typically comprised of polysilicon) in the logic region 100L. The hard mask layer 30 is comprised of a material that is resistant to the etchant used to form the gate structures in the logic regions 100L and it serves to protect at least the underlying control gate 20D (which is also typically made of polysilicon) during the gate etching process. The patterned mask layer 40 may be a patterned layer of photoresist that may be formed using known photolithography tools and techniques. In one illustrative embodiment, the ODL layer 36 has a thickness of about 150-400 nm and it is initially formed by performing a lithography process. In one illustrative embodiment, the ARC layer 38 is a silicon based ARC material, it has a thickness of about 20-30 nm and it is initially formed by performing a lithography process.

Figure 1F:
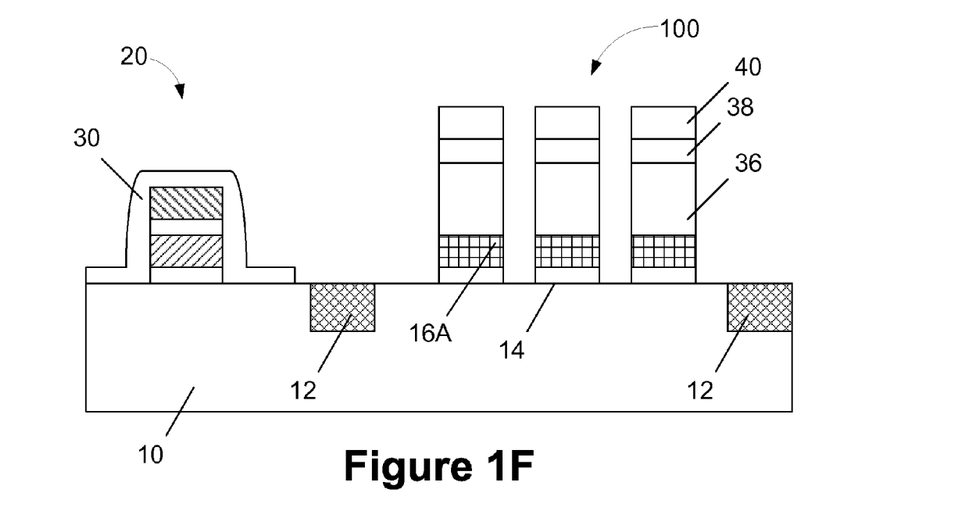

Next, as shown in FIG. 1F, one or more dry or wet etching processes are performed through the mask layer 40 to remove the exposed portions of the ARC layer 38, the ODL layer 36, the gate electrode material layer 16 and the gate insulation layer 14. In one illustrative embodiment, one or more dry anisotropic etching processes are performed to remove these various layers of material. These etching processes define a plurality of gate electrodes 16A for various transistors that will be formed in the logic region 100L of the device 100.

Note that during these various etching processes, the protective mask layer 30 remains on the memory device 20 and protects the memory device 20, or components thereof, from undesirable attack during the etching processes.

Figure 1G:
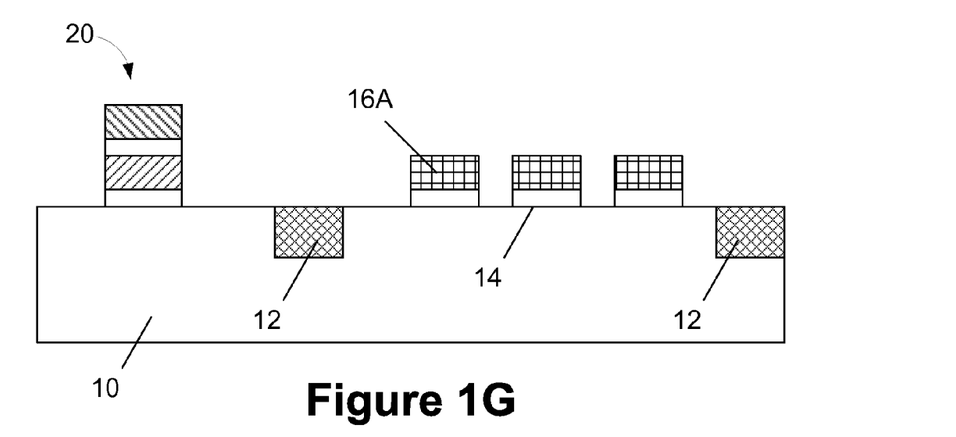

Then, as shown in FIG. 1G, the protective mask layer 30 is removed from above the memory device 20 and a general cleaning (etching) process is performed on the device 100 to produce a device that is ready for subsequent processing operations. In one illustrative embodiment where the protective mask layer 30 is made of amorphous silicon, it may be removed by performing a process operation in situ. More specifically, in one example, after the etching process is performed in a process chamber to etch through the gate electrode material layer 16, e.g., a layer of polysilicon, the substrate remains positioned in the same process chamber and the etching chemistry employed may be changed such that it attacks the amorphous carbon protective mask layer 30. That is, in this illustrative embodiment, the removal of the protective mask layer 30 is done prior to removing the substrate from the process chamber. In one illustrative embodiment, etchants such as a plasma comprising ozone, oxygen, hydrogen, etc., may be employed in such an in situ process to remove the amorphous carbon protective mask layer 30. In other embodiments, the protective mask layer 30 may be removed using an ex situ technique. That is, if necessary, a masking layer (not shown) may be employed to cover features of the device 100 other than the protective mask layer 30 and an etching process may be performed to remove the protective mask layer 30 from above the memory device 20.

Figure 2A:
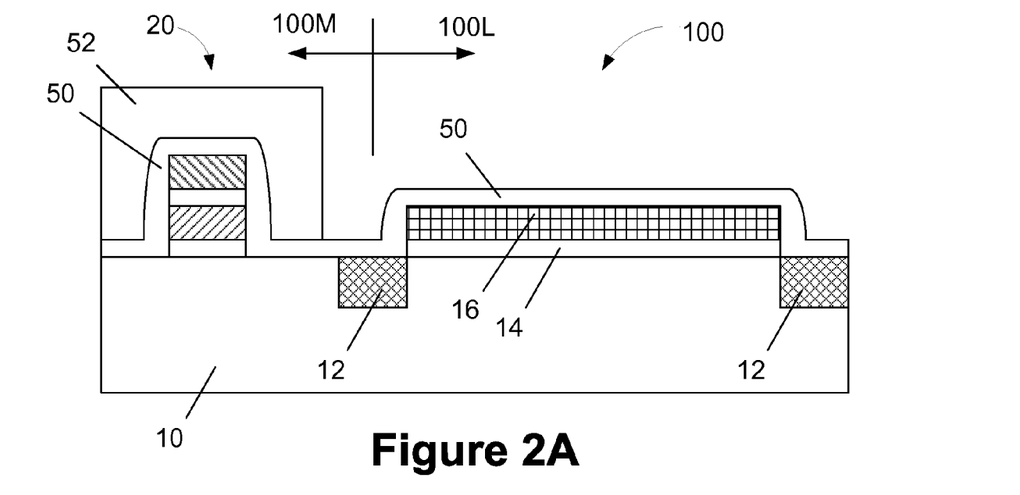
FIGS. 2A-2F depict other illustrative methods of protecting elevated polysilicon structures during etching processes.

FIGS. 2A-2F depict other illustrative techniques for forming a protective mask layer 50 above the memory device 20. As shown in FIG. 2A, a protective mask layer 50 is formed above the device 100 in both the logic region 100L and the memory region 100M and a masking layer 52 is formed above the memory device 20. The protective mask layer 50 may be comprised of a variety of different materials such as silicon dioxide, TEOS (tetraethylorthosilicate), a low temperature oxide (LTO), silicon oxynitride, etc. In general, the protective mask layer 50 may be comprised of any material that exhibits a relatively low etch rate when exposed to etch processes used to etch polysilicon, like etch processes that use chlorine or SF6, but at the same time is a material that may be easily removed by performing, for example, a wet etching process using a chemical like HF. In one illustrative embodiment, the protective mask layer 50 is a hard mask layer of silicon dioxide having a thickness of about 30-50 nm that is initially formed by performing a CVD process. The patterned mask layer 52 may be a patterned layer of photoresist that may be formed using known photolithography tools and techniques.

Figure 2B:
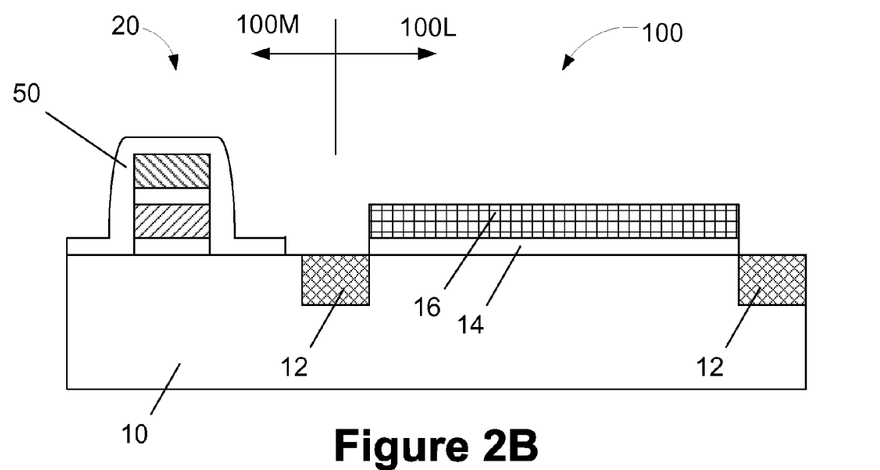

Next, as shown in FIG. 2B, one or more dry or wet etching processes are performed through the mask layer 52 to remove the exposed portions of the protective mask layer 50. In one illustrative embodiment, one or more dry anisotropic etching processes are performed to remove the exposed portions of the protective hard mask layer 50. Thereafter, the mask layer 52 is removed from the memory region 100M. The mask layer 52 may be removed by performing any of a variety of known techniques, e.g., an ashing process.

Figure 2C:
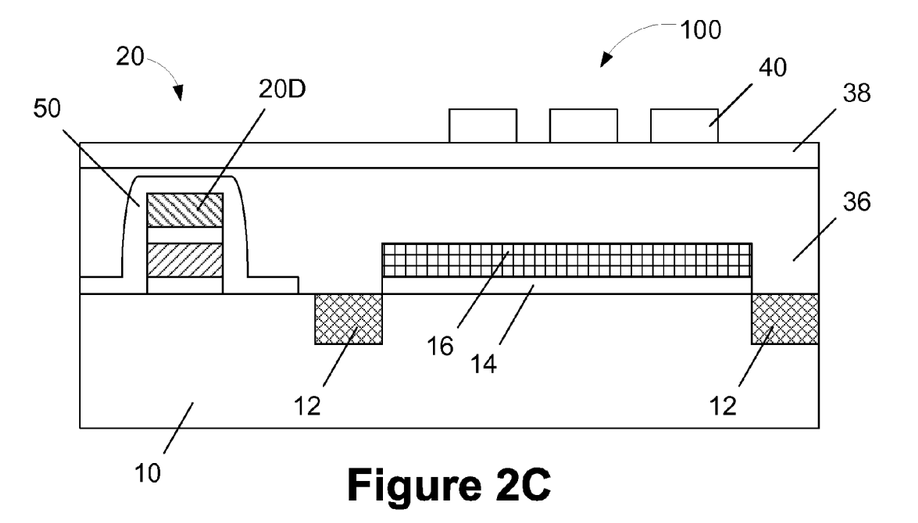

The next process operation generally involves forming gate electrode structures for the logic devices in the logic region 100L. To that end, as shown in FIG. 2C, in one illustrative embodiment, the multi-layer system described above in connection with FIG. 1F is employed to accomplish this task. That is, in one illustrative example, the ODL layer 36, the ARC layer 38 and the patterned mask layer 40 are formed above the device 100. Note that the protective mask layer 50 remains on the memory device 20 during this process.

Figure 2D:
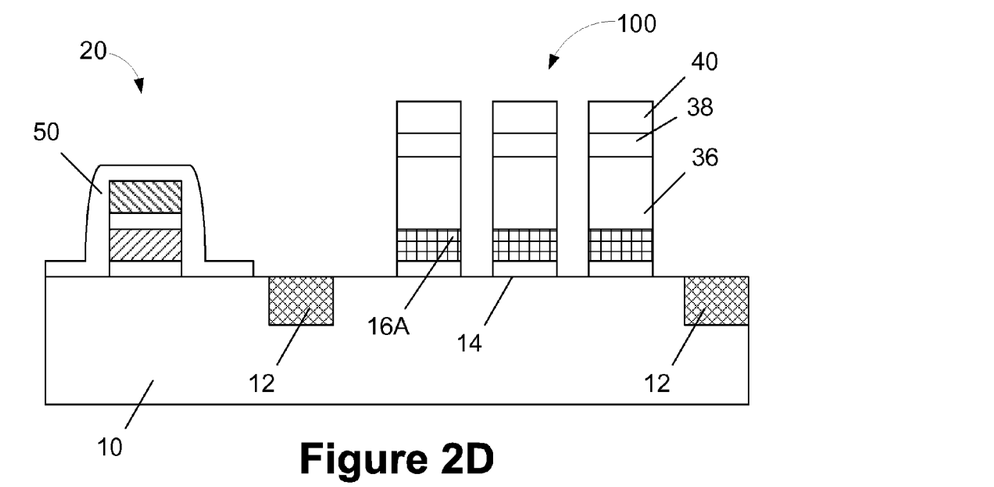

Next, as shown in FIG. 2D, one or more dry or wet etching processes are performed through the mask layer 40 to remove the exposed portions of the ARC layer 38, the ODL layer 36, the gate electrode material layer 16 and the gate insulation layer 14. In one illustrative embodiment, one or more dry anisotropic etching processes are performed to remove these various layers of material. These etching processes define a plurality of gate electrodes 16A for various transistors that will be formed in the logic region 100L of the device 100. Note that during these various etching processes, the protective mask layer 50 remains on the memory device 20 and protects the memory device 20, or components thereof, from undesirable attack during these etching processes. Similar to the previous embodiment, without the hard mask layer 50, depending upon the thickness of the ODL layer 36 and the ARC layer 38, a situation may arise where the combined height of the ODL layer 36 and the ARC layer 38 would offer little if any protection to the memory device 20 during the etching process that is performed to form the gate electrode structures (typically comprised of polysilicon) in the logic region 100L. The hard mask layer 50 is comprised of a material that is resistant to the etchant used to form the gate structures in the logic regions 100L and it serves to protect at least the underlying control gate 20D (which is also typically made of polysilicon) during the gate etching process.

Figure 2E:
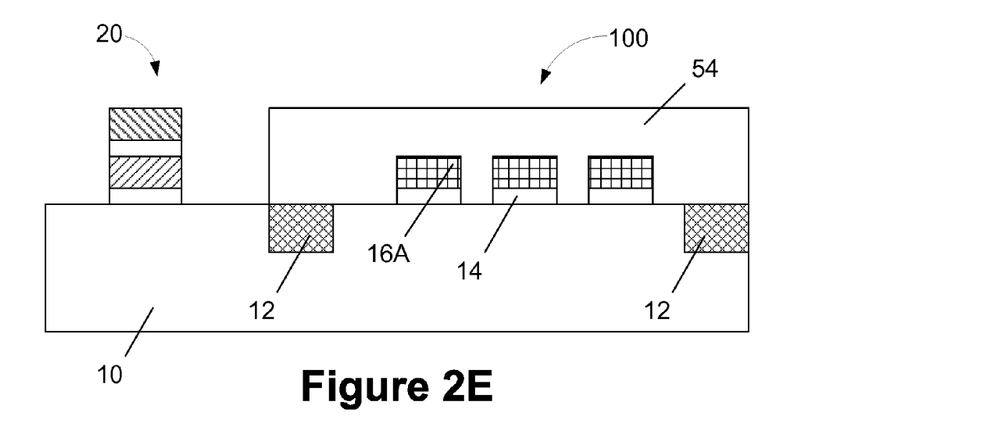
Figure 2F:
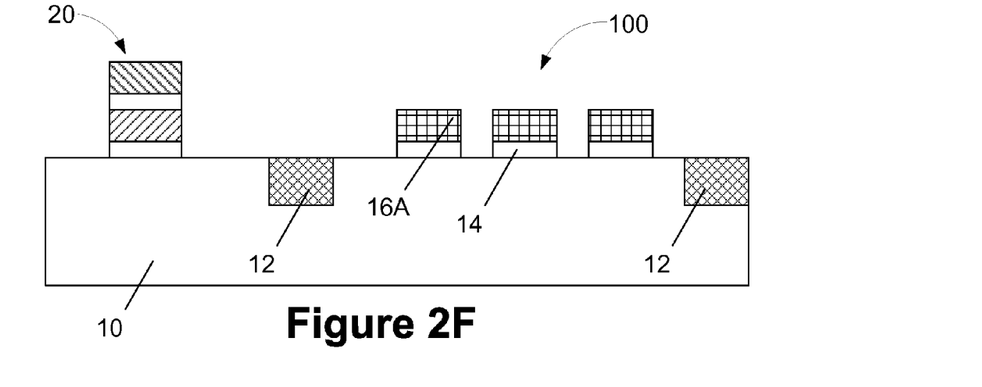

Next, as shown in FIG. 2E, a mask layer 54, e.g., a photoresist mask, is formed over the logic region 100L and an etching process is performed to remove the protective mask layer 50 from above the memory device 20. In one illustrative example, a dry etching process is performed to remove the protective mask layer 50. Then, as shown in FIG. 2F, a general cleaning (etching) process is performed on the device 100 to produce a device that is ready for subsequent processing operations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a layer stack above a semiconducting substrate for a memory device;
    forming a protective mask layer above said layer stack of said memory device;
    positioning said substrate in a process chamber and thereafter performing at least one etching process in said process chamber to define a gate electrode for a transistor while said protective mask is in position above said layer stack for said memory device; and
    after performing said at least one etching process in said process chamber, removing said protective mask layer from above said layer stack of said memory device by performing a process operation in said process chamber before removing said substrate from said process chamber.

2. The method of claim 1, wherein forming said protective mask layer above said layer stack of said memory device comprises forming said protective hard mask layer from at least one of silicon dioxide, amorphous carbon, a carbon based material, an organic material or photoresist.

3. The method of claim 1, wherein at least one of said layers of said layer stack of said memory device and said gate electrode are comprised of the same material.

4. The method of claim 1, wherein said protective mask layer is a layer of material that exhibits a relatively low etch rate when exposed to an etching process that is performed to remove polysilicon.

5. The method of claim 1, wherein an overall height of said layer stack for said memory device is greater than an overall height of said gate electrode for said transistor.

6. A method, comprising:
    forming a layer stack above a semiconducting substrate for a memory device;
    forming a layer of gate electrode material for a transistor;
    forming a protective mask layer above said layer stack for said memory device and above said layer of gate electrode material;
    performing at least one etching process to remove said protective mask layer from above layer of gate electrode material to thereby define a protective mask positioned above said layer stack for said memory device;
    performing at least one etching process on said layer of gate electrode material to define a gate electrode for a transistor while said protective mask is in position above said layer stack for said memory device; and
    after performing said at least one etching process on said layer of gate electrode material to define said gate electrode for said transistor, removing said protective mask from above said layer stack of said memory device by:
        forming a patterned mask layer above said substrate that exposes said protective mask; and
        performing an etching process through said patterned mask layer to remove said protective mask.

7. The method of claim 6, wherein forming said protective mask layer comprises forming said protective hard mask layer from at least one of silicon dioxide, amorphous carbon, a carbon based material, an organic material or photoresist.

8. The method of claim 6, wherein at least one of said layers of said layer stack of said memory device and said layer of gate electrode material are comprised of the same material.

9. The method of claim 6, wherein said layer of gate electrode material is comprised of polysilicon and said protective mask layer is a layer of material that exhibits a relatively low etch rate when exposed to said at least one etching process on said layer of gate electrode material.

10. The method of claim 6, wherein an overall height of said layer stack for said memory device is greater than an overall height of said gate electrode for said transistor.

11. A method, comprising:
    forming a layer stack above a semiconducting substrate for a memory device;
    forming a protective mask layer above said layer stack of said memory device;
    performing at least one etching process to define a gate electrode for a transistor while said protective mask is in position above said layer stack for said memory device; and
    after performing said at least one etching process, removing said protective mask layer from above said layer stack of said memory device by:
        forming a patterned mask layer above said substrate that exposes said protective mask layer; and
        performing an etching process through said patterned mask layer to remove said protective mask layer.

12. A method, comprising:

forming a layer stack above a semiconducting substrate for a memory device;

forming a layer of gate electrode material for a transistor;

forming a protective mask layer above said layer stack for said memory device and above said layer of gate electrode material;

performing at least one etching process to remove said protective mask layer from above said layer of gate electrode material to thereby define a protective mask positioned above said layer stack for said memory device;

positioning said substrate in a process chamber and thereafter performing at least one etching process on said layer of gate electrode material to define a gate electrode for a transistor while said protective mask is in position above said layer stack for said memory device; and after performing said at least one etching process on said layer of gate electrode material to define said gate electrode for said transistor in said process chamber, removing said protective mask from above said layer stack of said memory device by performing a process operation in said process chamber before removing said substrate from said process chamber.

* * * * *